US009349789B1

(12) United States Patent
Vega

(10) Patent No.: US 9,349,789 B1
(45) Date of Patent: May 24, 2016

(54) COAXIAL CARBON NANOTUBE CAPACITOR FOR EDRAM

(71) Applicant: International Business Machines Corporation, Armonk, NY (US)

(72) Inventor: Reinaldo A. Vega, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/564,655

(22) Filed: Dec. 9, 2014

(51) Int. Cl.
*H01L 27/108* (2006.01)
*H01L 49/02* (2006.01)

(52) U.S. Cl.
CPC .......... *H01L 28/91* (2013.01); *H01L 27/10829* (2013.01); *H01L 27/10861* (2013.01)

(58) Field of Classification Search
CPC ...................................... H01L 28/91
USPC ............................................ 257/301
See application file for complete search history.

(56) References Cited

U.S. PATENT DOCUMENTS

| 6,188,096 | B1 | 2/2001 | Collins et al. |
| 6,858,891 | B2 | 2/2005 | Farnworth et al. |
| 7,081,383 | B2 | 7/2006 | Gutsche et al. |
| 7,667,296 | B2 | 2/2010 | Stumbo et al. |
| 7,688,570 | B2 | 3/2010 | Lee et al. |
| 7,933,160 | B2 | 4/2011 | Kim |
| 8,143,135 | B2 | 3/2012 | Kemerer et al. |
| 8,405,189 | B1 | 3/2013 | Ward et al. |
| 8,441,103 | B2 | 5/2013 | Kemerer et al. |
| 2008/0142866 | A1 | 6/2008 | Choi et al. |
| 2011/0073827 | A1 | 3/2011 | Rubloff et al. |
| 2013/0134071 | A1 | 5/2013 | Singer |

FOREIGN PATENT DOCUMENTS

| DE | 102004060569 A1 | 6/2006 |
| GB | 2501823 | 11/2013 |
| JP | 63226057 | 9/1988 |
| JP | 2004146520 | 5/2004 |
| WO | 2012/010834 A2 | 1/2012 |

OTHER PUBLICATIONS

Han, Z. J. et al., "Controlled synthesis of a large fraction of metallic single-walled carbon nanotube and semiconducting carbon nanowire networks", Nanoscale, 2011, pp. 3214-3220, vol. 3.
Reddy, A. et al., "Multisegmented Au—MnO2/Carbon Nanotube Hybrid Coaxial Arrays for High-Power Supercapacitor Applications", J. Phys. Chem. C, 2010, pp. 658-663, vol. 114, No. 1.
Reddy, A. et al., "Coaxial MnO2/Carbon Nanotube Array Electrodes for High-Performance Lithium Batteries", Nano Letters, 2009, pp. 1002-1006, vol. 9, No. 3.

(Continued)

*Primary Examiner* — Anthony Ho
(74) *Attorney, Agent, or Firm* — Scully, Scott, Murphy & Presser, P.C.; Steven J. Meyers

(57) ABSTRACT

A deep trench (DT) opening is provided in a semiconductor substrate and then conducting carbon nanotubes are formed within the DT. Each conducting carbon nanotube is coated with a high k dielectric material and thereafter the remaining volume of the DT is filled with a conductive material.

11 Claims, 12 Drawing Sheets

(56) References Cited

OTHER PUBLICATIONS

Wang, Q. et al., "Facilitated Lithium Storage in MoS2 Overlayers Supported on Coaxial Carbon Nanotubes", J. Phys. Chem. C, 2007, vol. 111, 1675-1682.

Lee, S. et al., "Carbon Nanotube/Manganese Oxide Ultrathin Film Electrodes for Electrochemical Capacitors", ACS Nano, 2010, pp. 3889-3896, vol. 4, No. 7.

Cleveland, E.R., et al., "ALD Conformality and Optimization in Ultrahigh Aspect Ratio Nanopores for Electrical Energy Storage Nanodevices", PowerMEMS 2009, Dec. 1-4, 2009, pp. 574-577, Washington DC.

Garces, N. Y., et al., "Graphene functionalization and seeding for dielectric deposition and device integration", J. Vac. Sci. Technol. B 30(3), May/Jun. 2012, pp. 030801-1 to 030801-21.

Esconjauregui, S., et al., "Growth of Ultrahigh Density Vertically Aligned Carbon Nanotube Forests for Interconnects", ACS Nano, Dec. 3, 2010, pp. 7431-7436, vol., No. 12.

He, M., et al., "Chiral-Selective Growth of Single-Walled Carbon Nanotubes on Lattice-Mismatched Epitaxial Cobalt Nanoparticles", Scientific Reports, Mar. 15, 2013, pp. 1-7, 3 : 1460.

Ghosh, A., et al., "TLM-PSD model for optimization of energy and power density of vertically aligned carbon nanotube supercapacitor", Scientific Reports, Oct. 22, 2013, pp. 1-10, 3 : 2939.

COAXIAL CARBON NANOTUBE CAPACITOR FOR EDRAM

BACKGROUND

The present application relates to a semiconductor structure and a method of forming the same. More particularly, the present application relates to a semiconductor structure including a deep trench capacitor having an increased total capacitance.

Deep trench (DT) capacitors can be used as memory elements in semiconductor structures. More specifically, embedded dynamic random access memory (eDRAM) devices may utilize deep trenches as memory elements. However, as semiconductor technology improves and eDRAM devices continue to become smaller in size, fabrication of (DT) capacitors has become more difficult. Further, and with this scaling, the top down surface area of the eDRAM is reduced. Thus, and in order to keep the same capacitance, the DT capacitor, to which a bit is written, must be made deeper and/or filled with a high dielectric constant dielectric material. There is however a limit on how large the dielectric constant of the dielectric material can be made, and how deep the DT can be etched. There is thus a need for providing an eDRAM having improved cell capacitance as the bit size cell is scaled down.

SUMMARY

A deep trench (DT) opening is provided in a semiconductor substrate and then conducting carbon nanotubes are formed within the DT. Each conducting carbon nanotube is coated with a high k dielectric material and thereafter the remaining volume of the DT is filled with a conductive material.

In one aspect of the present application, a semiconductor structure is provided. In accordance with an embodiment of the present application, the semiconductor structure includes a capacitor structure present in a deep trench that is located within a semiconductor substrate. The capacitor structure of the present application includes a metal liner located on sidewalls and a bottom wall of the deep trench. A layer of dielectric material is located on a horizontal surface of the metal liner. A plurality of nanoparticle seed layers is present on a topmost surface of the layer of dielectric material. Conducting carbon nanotubes extend vertical upwards from a surface of each nanoparticle seed layer. A high k dielectric portion lines each conducting carbon nanotube and is present on exposed vertical sidewalls of the metal liner. A conductive material plug fills the remaining volume of the deep trench.

In another aspect of the present application, a method of forming a semiconductor structure is provided. In accordance with an embodiment of the present application, the method includes providing a deep trench within a semiconductor substrate. Next, a metal liner is formed on sidewalls and a bottom wall of the deep trench. A layer of dielectric material is then formed on a horizontal surface of the metal liner, and thereafter a plurality of nanoparticle seed layers is provided on a topmost surface of the layer of dielectric material. Next, conducting carbon nanotubes are formed extending vertical upwards from a surface of each nanoparticle seed layer, and thereafter a high k dielectric portion is provided lining each conducting carbon nanotube and present on exposed vertical sidewalls of the metal liner. A conductive material plug is then formed filling the remaining volume of the deep trench.

DESCRIPTION

Figure 1:
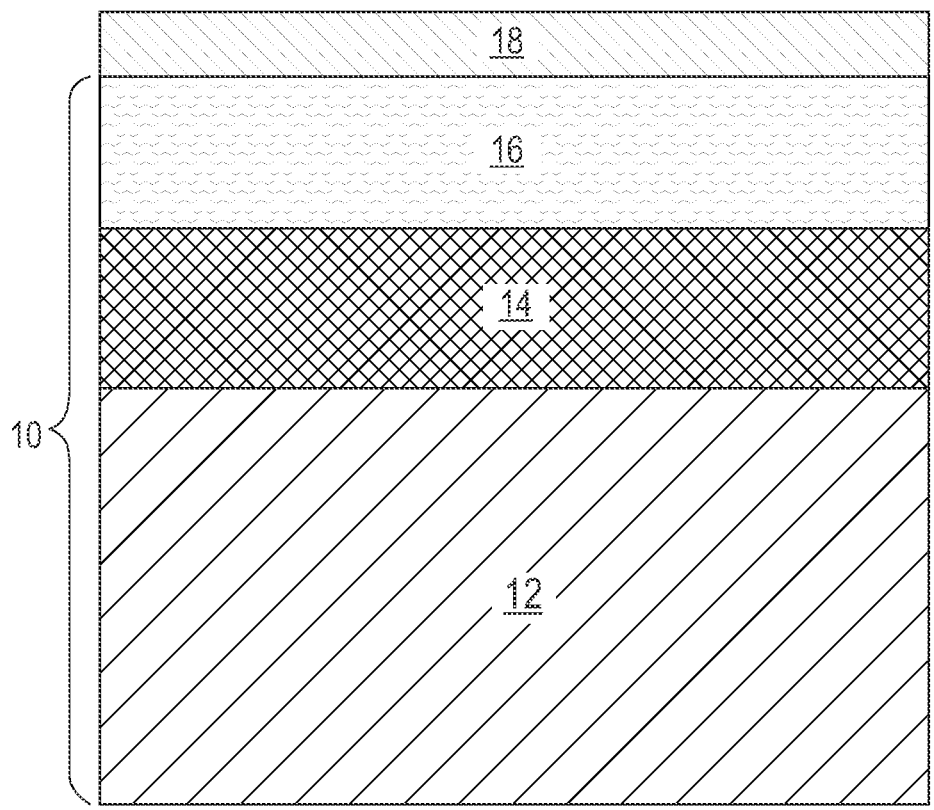
FIG. 1 is a cross sectional view of an exemplary semiconductor structure including a hard mask layer located on a topmost surface of a semiconductor substrate that includes, from bottom to top, a handle substrate, an insulator layer and a topmost semiconductor layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application addresses the challenge of maintaining or even increasing the eDRAM cell capacitance as the bit cell size is scaled down. In some embodiments, the present application can increase the capacitance per unit layout area for a given deep trench (DT) depth and dielectric constant. As stated above, a DT opening is provided in a semiconductor substrate and then conducting carbon nanotubes are formed in the DT opening. Each conducting carbon nanotube is coated with a high k dielectric material and thereafter the remaining volume of the DT is filled with a conductive material. An access transistor is present on a surface of the semiconductor substrate and adjacent the DT. The access transistor can be formed either prior to or after formation of the conducting carbon nanotube filled DT. The conducting carbon nanotubes serve as a ground terminal and the conductive material is connected to the access transistor. By concentrating the electric field from the conducting tubes inwards, i.e., toward the conducting carbon nanotubes, as the conducting carbon nanotubes diameter is reduced, the capacitance per unit area to each conducting carbon nanotube can be increased. In some embodiments of the present application, this increase can be greater than 2× for conducting carbon nanotube diameters below 5 nm and a high k dielectric thickness of approximately 1 nm.

The following description and drawings illustrate an embodiment of the present application in which the formation of the array of conducting carbon nanotubes occurs in a DT opening formed into a semiconductor substrate prior to formation of an access transistor. In another embodiment of the present application (not shown), the access transistor can be formed on the surface of the semiconductor substrate prior to formation of the DT opening and prior to filling the DT opening with the array of conducting carbon nanotubes.

Referring first to FIG. 1, there is illustrated an exemplary semiconductor structure including a hard mask layer 18 located on a topmost surface of a semiconductor substrate 10 that includes, from bottom to top, a handle substrate 12, an insulator layer 14 and a topmost semiconductor layer 16 that can be employed in accordance with an embodiment of the present application.

Although semiconductor substrate 10 is described and illustrated as a semiconductor-on-insulator substrate, the present application also contemplates embodiments in which the semiconductor substrate 10 is a bulk semiconductor substrate. The term "bulk" when used in conjunction with the term "semiconductor substrate" denotes that the entire substrate is comprised of at least one semiconductor material. The at least one semiconductor material that can constituent the bulk semiconductor substrate can include one of the semiconductor materials mentioned below for the topmost semiconductor layer 16. In accordance with the present application, at least an upper portion of the bulk semiconductor substrate contains a doped region (p- or n-type) such that at least the upper portion of the bulk semiconductor substrate is made conductive.

In the embodiment illustrated, semiconductor substrate is a semiconductor-on-insulator substrate that includes the handle substrate 12, the insulator layer 14 and the topmost semiconductor layer 16. The handle substrate 12 provides mechanical support for the insulator layer 14 and the topmost semiconductor layer 16 of the semiconductor-on-insulator (SOI) substrate. In some embodiments of the present application, the handle substrate 12 and the topmost semiconductor layer 16 of the SOI substrate may comprise a same semiconductor material. In other embodiments of the present application, the handle substrate 12 and the topmost semiconductor layer 16 of the SOI substrate may comprise a different semiconductor material. The semiconductor material(s) that can be used as the handle substrate 12 and the topmost semiconductor layer 16 includes at least one semiconductor material. Exemplary semiconductor materials that can be used as the semiconductor material for the handle substrate 12 and the topmost semiconductor layer 16 of the SOI substrate include, but are not limited to, Si, Ge, SiGe, SiC, SiGeC, III/V compound semiconductors such as, for example, InAs, InP, InAsP, and GaAs, and II/VI compound semiconductor materials. In one embodiment, the handle substrate 12 and the topmost semiconductor layer 16 of the SOI substrate are both comprised of silicon. In some embodiments, the handle substrate 12 is a non-semiconductor material including, for example, a conductive metal material.

The handle substrate 12 and the topmost semiconductor layer 16 of the SOI substrate may have the same or different crystal orientation. The crystal orientation of the handle substrate 12 and the topmost semiconductor layer 16 of the SOI substrate may be {100}, {110}, or {111}. Other crystallographic orientations besides those specifically mentioned can also be used in the present application. The handle substrate 12 and/or the topmost semiconductor layer 16 of the SOI substrate may be a single crystalline semiconductor material, a polycrystalline material, or an amorphous material. Typically, at least the topmost semiconductor layer 16 of the SOI substrate is a single crystalline semiconductor material. In embodiments in which the handle substrate 12 of the SOI substrate is a semiconductor material, the semiconductor material that provides the handle substrate 12 contains an n-type or p-dopant region such that at least a portion of the handle substrate 12 is conductive. The n-type or p-dopant region can extend entirely through the handle substrate 12 or it can be present in an upper portion of the handle substrate 12.

The insulator layer 14 of the SOI substrate may be a crystalline or non-crystalline oxide or nitride. In one embodiment, the insulator layer 14 is an oxide such as, for example, silicon dioxide. In another embodiment, the insulator layer 14 may include a stack of silicon dioxide and boron nitride.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of topmost semiconductor layer 16 of the SOI substrate is typically from 10 nm to 100 nm, although other thicknesses that are lesser than or greater than the aforementioned thickness range may also be used for the thickness of the topmost semiconductor layer 16 of the SOI substrate. The insulator layer 14 of the SOI substrate typically has a thickness from 1 nm to 200 nm, although other thicknesses that are lesser than or greater than the aforementioned thickness range from the insulator layer 14 of the SOI substrate can be used. The thickness of the handle substrate 12 of the SOI substrate is inconsequential to the present application.

After providing the semiconductor substrate 10, hard mask layer 18 can be formed on a topmost surface of either the bulk semiconductor substrate or the SOI substrate. In the particular illustrated embodiment, the hard mask layer 18 is formed on a topmost surface of the topmost semiconductor layer 16. The hard mask layer 18 that can be employed is a contiguous layer that covers the entirety of the topmost surface of the semiconductor substrate 10, i.e., bulk semiconductor substrate or the SOI substrate. The hard mask layer 18 that can be employed in the present application may include a semiconductor oxide, a semiconductor nitride and/or a semiconductor oxynitride. In one embodiment, the hard mask material that can be used in providing the hard mask layer 18 can be comprised of silicon dioxide. In another embodiment, the hard mask material that can be used in providing the hard mask layer 18 can be comprised of silicon nitride. In yet another embodiment, the hard mask material that can be used in providing the hard mask layer 18 can be a stack comprised of, in any order, silicon dioxide and silicon nitride.

In some embodiments of the present application, the hard mask material that can be used in providing the hard mask layer 18 can be formed by a deposition process such as, for example, chemical vapor deposition (CVD) or plasma enhanced chemical vapor deposition (PECVD). In other embodiments, the hard mask material that can be used in providing the hard mask layer 18 can be formed by a thermal process such as, for example, thermal oxidation and/or thermal nitridation. In yet other embodiments, the hard mask material that can be used in providing the hard mask layer 18 can be formed by a combination of a deposition process and a thermal process. The thickness of the hard mask material that can be used in providing the hard mask layer 18 can range from 2 nm to 10 nm, although other thicknesses that are lesser than or greater than the aforementioned thickness range can be used for the hard mask layer 18.

Figure 2:
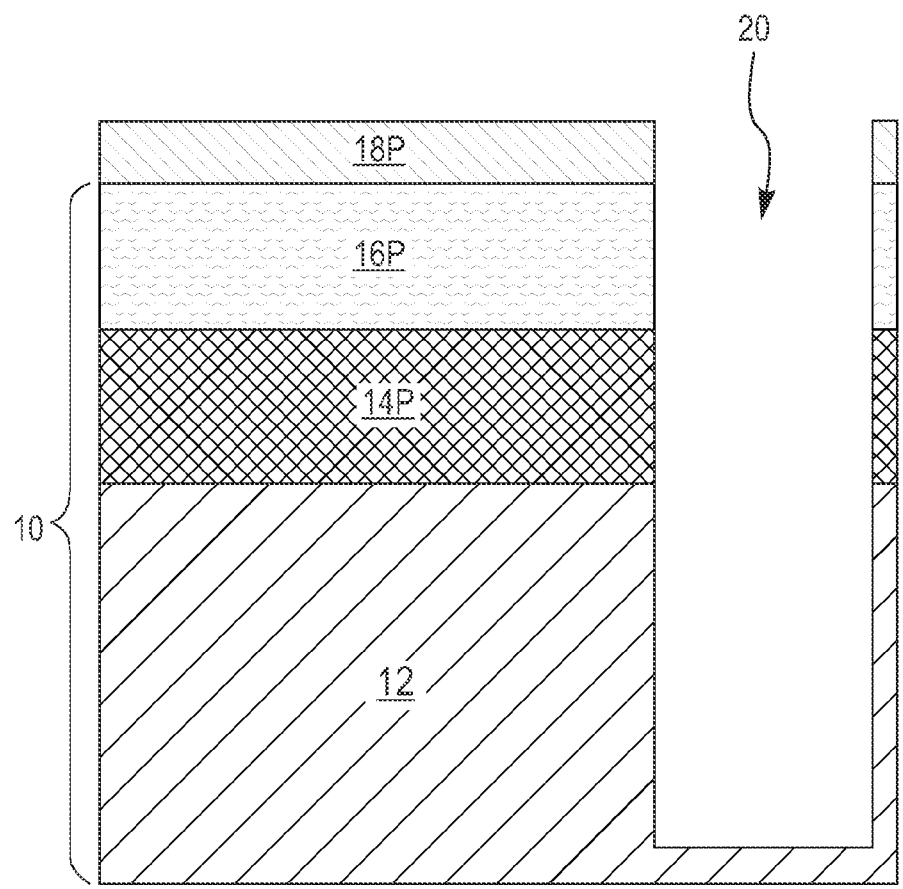
FIG. 2 is a cross sectional view of the exemplary semiconductor structure of FIG. 1 after forming a deep trench entirely through the hard mask layer, the topmost semiconductor layer, and the insulator layer and partially into the handle substrate.

Referring now to FIG. 2, there is illustrated the exemplary semiconductor structure of FIG. 1 after forming a deep trench 20 entirely though the hard mask layer 18, the topmost semiconductor layer 16, and the insulator layer 14, and partially into the handle substrate 12. In the present application, at least a lower portion of the deep trench 20 is formed within a conductive portion of the semiconductor substrate 10. Although a single deep trench 20 is described and illustrated, a plurality of such deep trenches can be formed into the hard mask layer 18 and into the semiconductor substrate 10.

After formation of the deep trench 20, portions of the hard mask layer 18, portions of the topmost semiconductor layer 16 and portions of the insulator layer 14 remain in the structure. Each remaining portion of the hard mask layer 18 may be referred herein as a hard mask portion 18P, each remaining portion of the topmost semiconductor layer 16 may be referred to herein as a topmost semiconductor portion 16P, while each remaining portion of the insulator layer 14 may be herein referred to as an insulator portion 14P.

The deep trench 20 that is formed exposes sidewall surfaces of the hard mask layer 18, the topmost semiconductor layer 16, the insulator layer 14 and the handle substrate 12. The deep trench 20 that is formed also exposes a sub-surface of the handle substrate 12. By "sub-surface" is it meant a surface of a material that is located beneath the original topmost surface of the material. In some embodiments of the present application, the deep trench 20 can extend from 2 to 5 microns below the topmost surface of the semiconductor substrate 10. In some instances, the deep trench 20 that is formed is shallower than a conventional deep trench and as such a warping effect may be avoided. In some embodiments and as shown, the deep trench 20 has vertical sidewalls. In other embodiments (not shown), the deep trench 20 may have tapered sidewalls.

The deep trench 20 can be formed by lithography and etching. The lithographic step used in providing the deep trench 20 includes forming a photoresist material (not shown) on the topmost surface of the hard mask layer 18, exposing the photoresist material to a desired pattern (i.e., deep trench pattern) of irradiation, and then developing the exposed photoresist material with a conventional resist developer. The pattern provided to the photoresist material is then transferred into the underlying hard mask layer 18 and semiconductor substrate 10 by at least one etching process. In one embodiment of the present application, the at least one etching process used to transfer the pattern may comprise a dry etching process such as, for example, reactive ion etching, ion beam etching, plasma etching or laser ablation. In another embodiment of the present application, the at least one etching process used to transfer the pattern may comprise a wet etching process. In another embodiment, any combination of dry and/or wet etching may be employed to transfer the pattern. In some embodiments of the present application, the patterned photoresist material can be removed from the structure after initial pattern transfer into the hard mask layer 18. In other embodiments, the patterned photoresist material can be removed after the entire pattern transfer process has been completed. In either embodiment, the patterned photoresist material can be removed utilizing a conventional resist stripping process such as ashing.

The deep trench 20 that can be formed can have any shape. For example, the deep trench 20 may be in the form of a square, rectangular, triangle, or circle. The deep trench 20 that is provided has sidewalls and a bottom wall.

Figure 3:
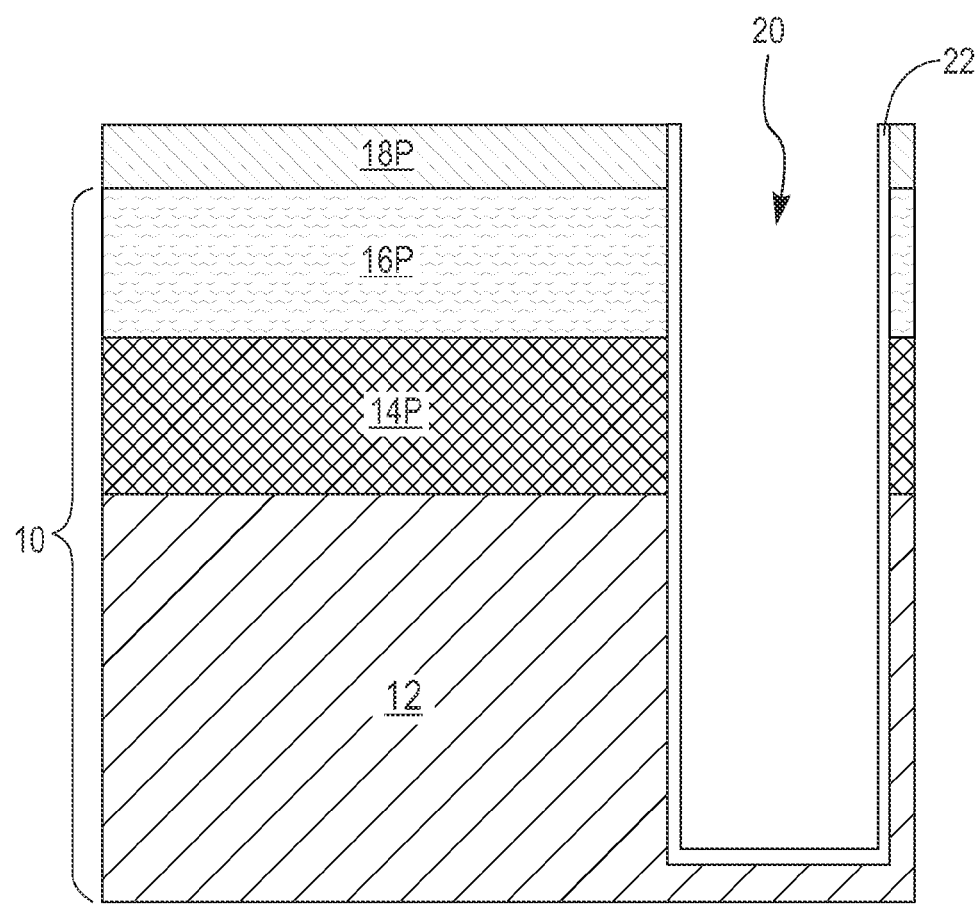
FIG. 3 is a cross sectional view of the exemplary semiconductor structure of FIG. 2 after forming a metal liner on exposed surfaces within the deep trench.

Referring now to FIG. 3, there is illustrated the exemplary semiconductor structure of FIG. 2 after forming a metal liner 22 on exposed surfaces within the deep trench 20. Notably, the metal liner 22 is contiguous layer that is formed on sidewall surfaces of each topmost semiconductor portion 16P and each insulator portion 14P, as well as sidewall surfaces and the sub-surface of the handle substrate 12.

The metal liner 22 can be composed of at least one metal-containing material such as, for example, Ta, TaN, Ti, TiN, Ru, RuN, RuTa, RuTaN, IrTa, IrTaN, W, and WN. The thickness of the metal-containing material used in forming the metal liner 22 may vary depending on the deposition process used as well as the material employed. In one embodiment of the present application, the metal-containing material that forms the metal liner 22 has a thickness from 5 nm to 40 nm. Other thicknesses that are lesser than or greater than the aforementioned thickness range can also be employed for the diffusion barrier material. The metal-containing material that forms the metal liner 22 may be formed by a deposition process, followed by a planarization process that removes the metal-containing material that is present on the topmost surface of the hard mask portions 18P. Examples of deposition processes that can be used in forming the metal-containing material that provides the metal liner 22 include, but are not limited to, CVD, PECVD, physical vapor deposition (PVD), sputtering or plating. In some embodiments, the planarization process can be omitted and performed later on in the process of the present application.

Figure 4:
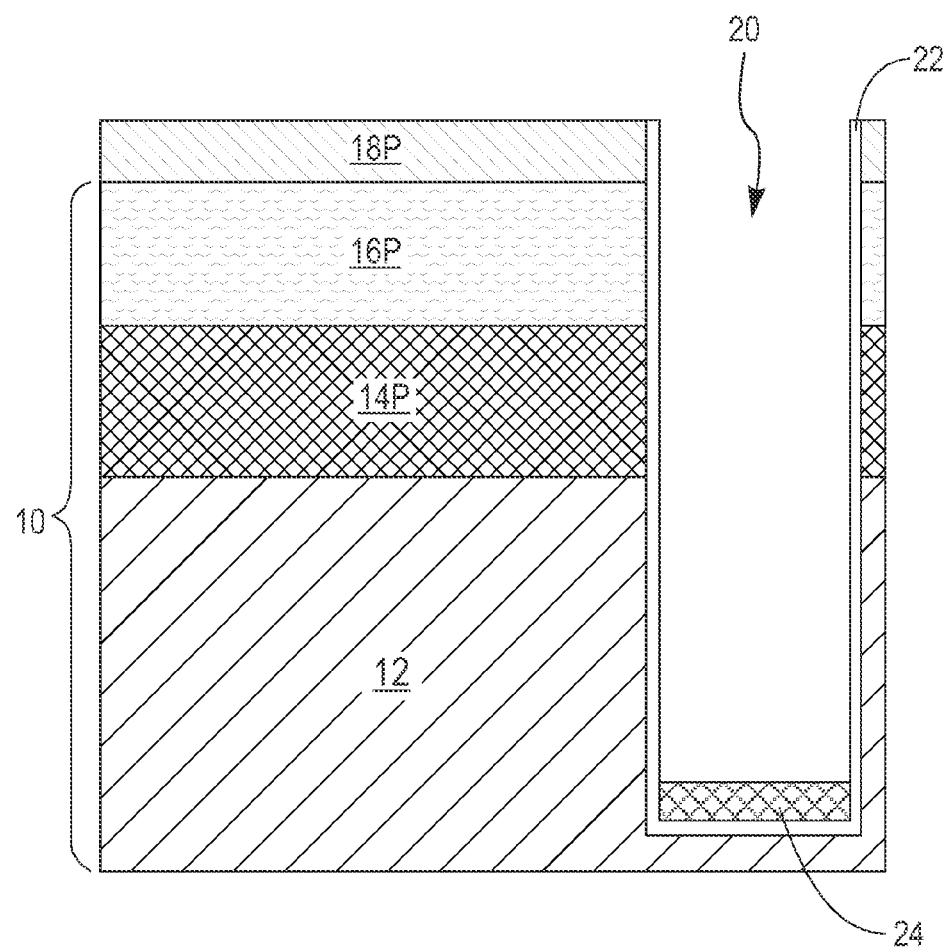
FIG. 4 is a cross sectional view of the exemplary semiconductor structure of FIG. 3 after forming a layer of dielectric material within a bottom portion of the deep trench and on an exposed horizontal surface of the metal liner.

Referring now to FIG. 4, there is illustrated the exemplary semiconductor structure of FIG. 3 after forming a layer of dielectric material 24 within a bottom portion of the deep trench 20 and on an exposed horizontal surface of the metal liner 22. As is shown, the layer of dielectric material 24 has sidewall surfaces that contact sidewall surfaces of the metal liner 22 in the lower portion of the deep trench 20.

The layer of dielectric material 24 may include any dielectric material, such as a dielectric metal oxide, that can immobilize a subsequently formed nanoparticle seed layer within the deep trench 20. Examples of dielectric materials that can provide the layer of dielectric material 24 include, but are not limited to, aluminum oxide, titanium oxide, chromium oxide and copper oxide. In one embodiment of the present application, a single dielectric material may be used in providing the layer of dielectric material 24. In another embodiment of the present application, a multilayered stack of dielectric materials may be used in providing the layer of dielectric material 24. In one embodiment of the present application, the layer of dielectric material 24 has a thickness from 5 nm to 50 nm. Other thicknesses that are lesser than or greater than the aforementioned thickness range can also be employed for the layer of dielectric material 24.

The layer of dielectric material 24 can be formed utilizing a directional deposition process. In some embodiments, and following the directional deposition process, a planarization process can be used to remove dielectric material that forms on the topmost surface of the hard mask portions 18P. In some embodiments, the planarization process may be omitted and performed during a later step of the present application.

In one embodiment of the present application, the directional deposition process that can be used in providing the layer of dielectric material 24 may comprise a gas cluster ion beam (GCIB) deposition process. Cluster ion beam deposition is a process in which high quality films are formed through clusters of electrically charged ions. In the present application, a cluster ion beam is used for film formation of the layer of dielectric material 24. In such a process, gas clusters are used to deposit the dielectric material that provides the layer of dielectric material 24. Gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

Other examples of directional deposition processes that can be used in providing the layer of dielectric material 24 include sputtering and chemical vapor deposition. In some embodiments and when chemical vapor deposition is employed, an etch back process may follow the chemical vapor deposition process to remove any material along the sidewall.

Figure 5:
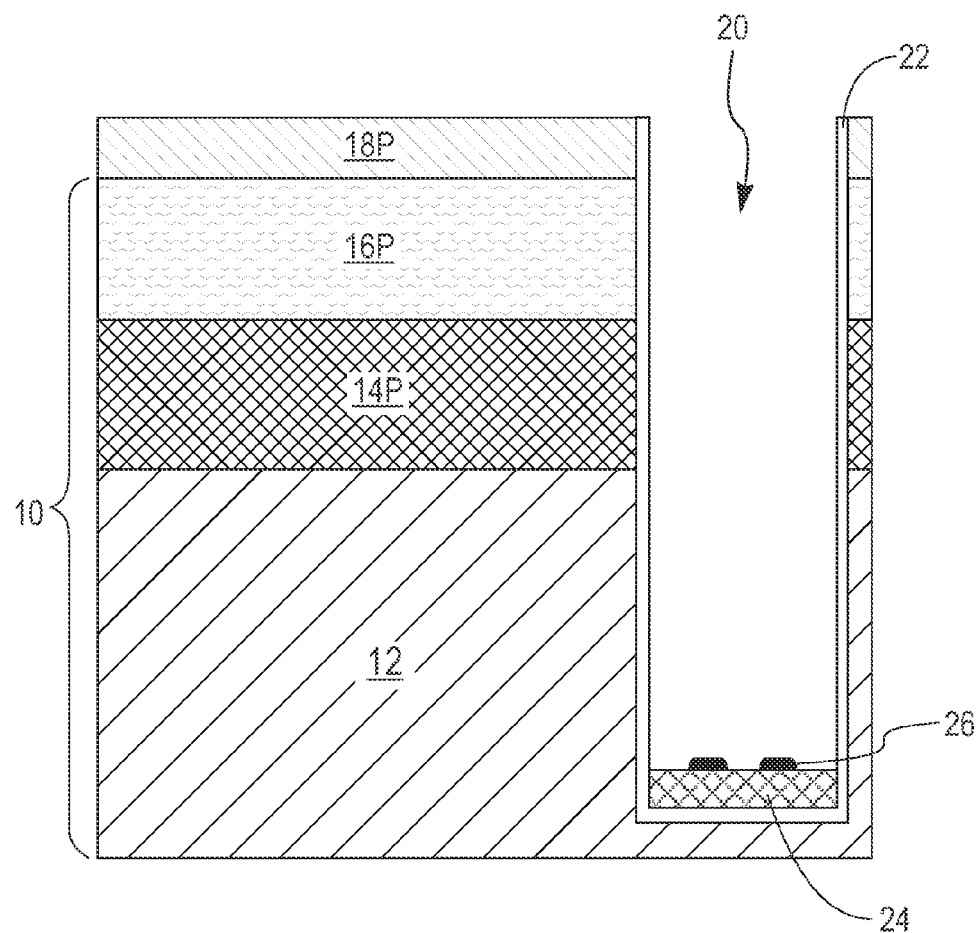
FIG. 5 is a cross sectional view of the exemplary semiconductor structure of FIG. 4 after forming a plurality of nanoparticle seed layers on portions of a topmost surface of the layer of dielectric material.

Referring now to FIG. 5, there is illustrated the exemplary semiconductor structure of FIG. 4 after forming a plurality of nanoparticle seed layers 26 on portions of a topmost surface of the layer of dielectric material 24 within the deep trench 20. Although not illustrated in the drawing, the density of the nanoparticle seed layers 26 that are formed is very high resulting in a conductive path across the layer of dielectric material 24 to the sidewalls of the metal liner 22.

Each nanoparticle seed layer 26 that is formed on the topmost surface of the layer of dielectric material 24 includes a metal that can catalyze the formation of a conducting carbon nanotube. Examples of metals that can catalyze the formation of a conducting carbon nanotube and thus can be used for providing each nanoparticle seed layer 26 include, iron, nickel, and cobalt. In one embodiment of the present application, each nanoparticle seed layer 26 that is provided has a thickness from 10 nm to 40 nm. Other thicknesses that are lesser than or greater than the aforementioned thickness range can also be employed for each nanoparticle seed layer 26.

In one embodiment of the present application, each nanoparticle seed layer 26 that is provided can be formed by deposition and annealing. Examples of deposition process that can be used in forming each nanoparticle seed layer 26 may include a directional deposition process include GCIB, and sputtering. In some embodiments of the present application, a directional metal deposition with collimated sputter etching can be used so as not to coat the sidewalls of the deep trench 20 with nanoparticle seed layers 26.

The anneal that is used in providing each nanoparticle seed layer 26 is typically performed at a temperature from 25° C. to 400° C. and in an inert ambient such as, for example, helium, argon and/or neon. In some embodiments, an oxidation process can follow the deposition and anneal. When employed, the oxidation process serves to further immobilize each nanoparticle seed layer 26 on the topmost surface of the layer of dielectric material 24. The oxidation is typically performed at a temperature from 25° C. to 400° C. and in an oxygen-containing ambient such as, for example, molecular oxygen, $NO_2$, ozone, and air. In some embodiments, the above processes may be repeated any number of times to form the proper conducting carbon nanotube density within the deep trench 20.

Figure 6:
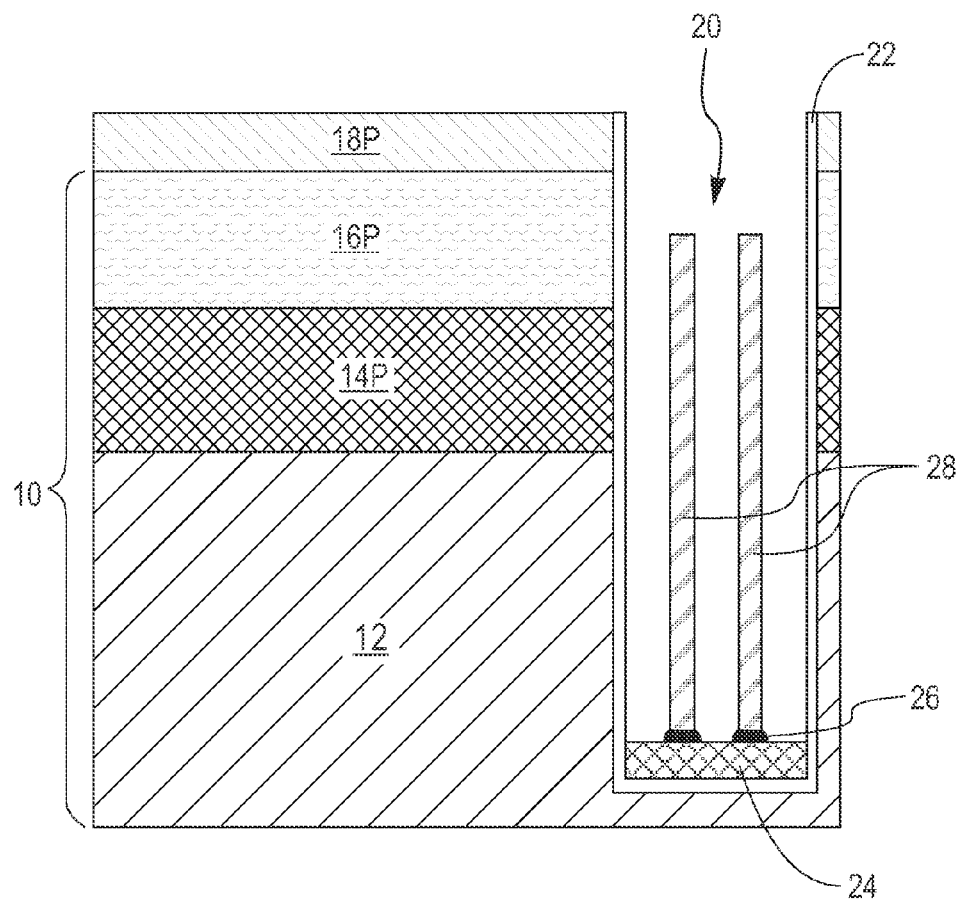
FIG. 6 is a cross sectional view of the exemplary semiconductor structure of FIG. 5 after formation of conducting carbon nanotubes from the exposed topmost surface of each nanoparticle seed layer.

Referring now to FIG. 6, there is illustrated the exemplary semiconductor structure of FIG. 5 after formation of conducting carbon nanotubes 28 (i.e., an array of conducting nanotubes) from the exposed topmost surface of each nanoparticle seed layer 26. As is shown, each conducting carbon nanotube 28 that is formed has a bottommost surface that forms an interface with a topmost surface of a particular nanoparticle seed layer 26. Also, each conducting carbon nanotube 28 extends vertically upward from the topmost surface of an underlying nanoparticle seed layer 26. Each conducting carbon nanotube 28 has a topmost surface that is located coplanar with, or beneath, the opening of the deep trench 20. In the embodiment illustrated, the topmost surface of each conducting carbon nanotube 28 is located between the topmost and bottommost surfaces of the topmost semiconductor portion 16P.

The conducting carbon nanotubes 28 that are provided in the present application have a cylindrical nanostructure. The conducting carbon nanotubes 28 of the present application are rolled at specific and discrete ("chiral") angles, and the combination of the rolling angle and radius decides the nanotube properties; for example, whether the individual nanotube has metallic properties or semiconducting properties. In the present application, the conducting carbon nanotubes 28 thus may comprise metallic carbon nanotubes, semiconducting carbon nanotubes or a combination thereof. Whether the carbon nanotubes are metallic or semiconducting depends on the chirality (i.e., twist) of the nanotube. Carbon nanotubes are metallic or semiconducting, based upon delocolatized electrons occupying a 1-D density of states. In one embodiment, the chirality of the carbon nanotubes provides metallic carbon nanotubes.

Each conducting carbon nanotube 28 can be formed by a deposition process such as for example chemical vapor deposition utilizing appropriate precursor source materials that can provide the conductive carbon nanotubes 28. In one embodiment of the present application, the conducting carbon nanotubes can be formed by chemical vapor deposition utilizing a carbon precursor source such as, for example, a hydrocarbon (i.e., methane, ethylene, acetylene, xylene, benzene, etc.).

Each conducting carbon nanotube 28 that is formed can have a height from greater than 0 microns to 5 microns and a width, as measured from one sidewall to another, from 1 nm to 2 nm. Other heights and widths are also possible. In some embodiments and as shown in FIG. 6, the width of each conducting carbon nanotube is less than the width of an underlying nanoparticle seed layer 26. In other embodiments of the present application (not shown), the width of each conducting carbon nanotube 28 is the same as the width of an underlying nanoparticle seed layer 26; in such an embodiment, the sidewalls of the conducting carbon nanotubes 28 are vertically coincident to the sidewalls of the underlying nanoparticle seed layer 26. In other embodiments (also not shown), a first set of conducting carbon nanotubes has a width that is less than a width of the underlying nanoparticle seed layer 26, while a second set of conducting carbon nanotubes has a width that is the same as a width of the underlying nanoparticle seed layer 26.

Figure 7:
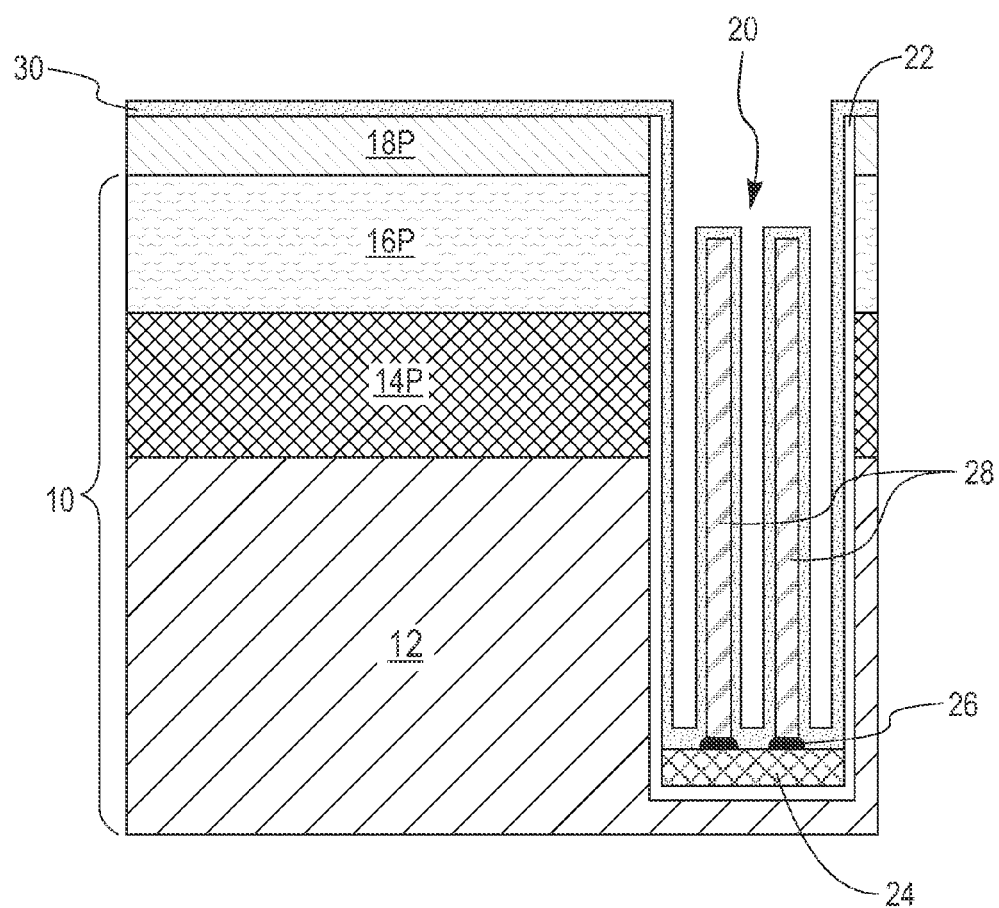
FIG. 7 is a cross sectional view of the exemplary semiconductor structure of FIG. 6 after coating the entirety of each conducting carbon nanotube with a high k dielectric material layer.

Referring now to FIG. 7, there is illustrated the exemplary semiconductor structure of FIG. 6 after coating the entirety of each conducting carbon nanotube 28 with a high k dielectric material layer 30. As is also shown, the high k dielectric material layer 30 is formed on exposed surfaces of the nanoparticle seed layer 26 (if any portion is exposed), the layer of dielectric material 24, the vertical sidewalls of the metal liner 22 and atop the hard mask portion 18P.

The term "high k" when used in conjunction with the term "high k dielectric material layer 30" denotes a dielectric material or stack of dielectric materials that has a dielectric constant that is greater than the dielectric constant of silicon dioxide. In some embodiments of the present application, the high k dielectric material layer 30 has a dielectric constant of about 8 or greater.

Exemplary high k dielectrics that can be used as the high k dielectric material layer 30 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high k dielectric material layer 30 can be formed by any deposition technique including, for example, chemical vapor deposition (CVD), plasma enhanced chemical vapor deposition (PECVD), physical vapor deposition (PVD), sputtering, or atomic layer deposition. The thickness of the high k dielectric material layer 30 can be from 5 to 50 nm, although other thicknesses that lesser than or greater than the aforementioned thickness range may also be employed.

Figure 8:
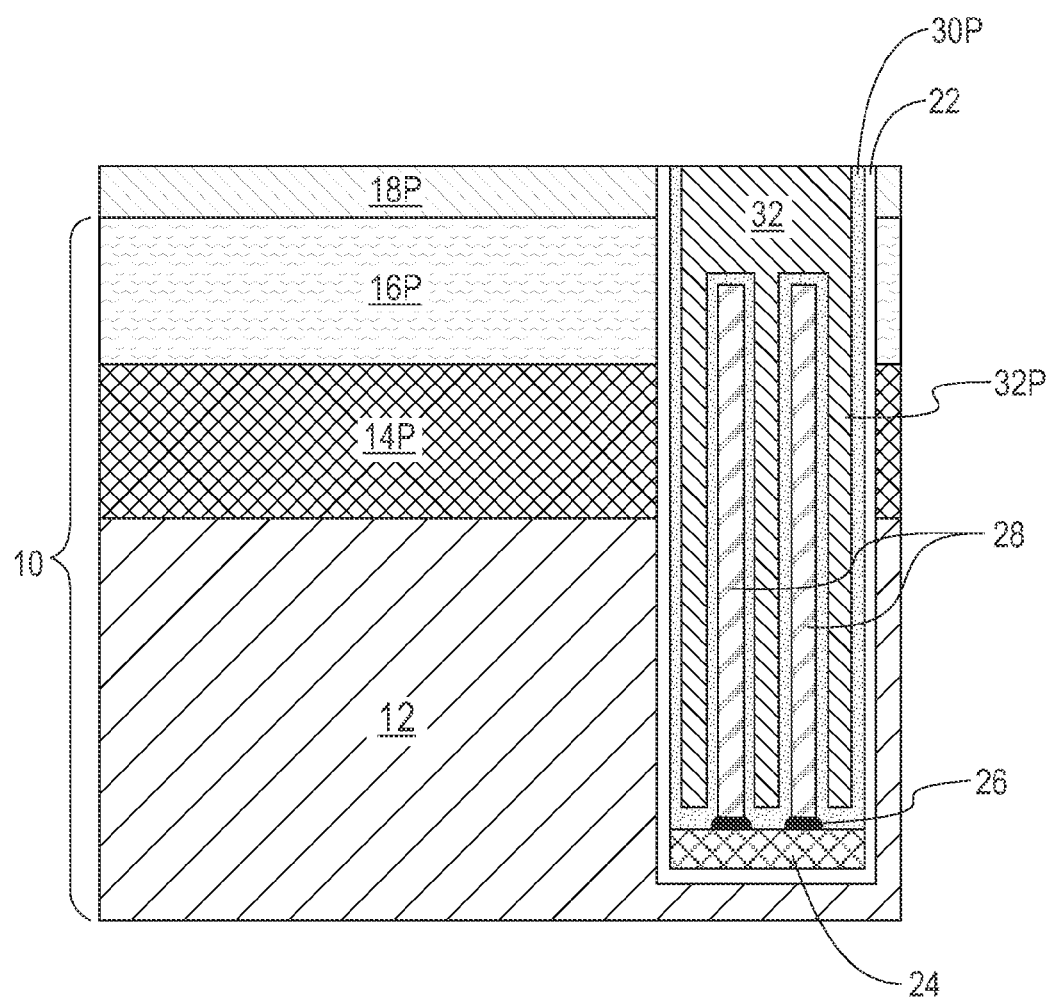
FIG. 8 is a cross sectional view of the exemplary semiconductor structure of FIG. 7 after filling the remaining volume of the deep trench with a conductive material.

Referring now to FIG. 8, there is illustrated the exemplary semiconductor structure of FIG. 7 after filling the remaining volume of the deep trench 20 with a conductive material 32. As is shown, the conductive material 32 that is provided into the deep trench 20 has a topmost surface that is coplanar with the topmost surface of each hard mask portion 18P.

In one embodiment of the present application, the conductive material 32 that can be employed in the present application is comprised of a conductive metal such as, for example, an elemental metal (e.g., tungsten, titanium, tantalum, aluminum, nickel, ruthenium, palladium and platinum), an alloy of at least two elemental metals, and an elemental metal nitride (e.g., tungsten nitride, aluminum nitride, and titanium nitride). The conductive metal can be formed by utilizing a deposition process such as, for example, CVD, PECVD, plating, or sputtering.

In another embodiment of the present application, the conductive material 32 that can be employed in the present application is comprised of a doped (n-type or p-type) semiconductor material such as for example doped silicon. The doped semiconductor material can be formed by a deposition process such as, for example, CVD utilizing well known semiconductor containing precursors. The dopant is typically introduced into the semiconductor material during the deposition process. In some embodiments, the dopant may be introduced into the semiconductor material after the deposition process utilizing gas phase doping, ion implantation or dopant outdiffusion from a sacrificial dopant source material.

In some embodiments of the present application, a planarization process such as, for example, chemical mechanical planarization and/or grinding can be used to provide the structure shown in FIG. 8. The planarization process removes any unwanted material (i.e., conductive material and high k dielectric material) from atop each hard mask portion 18P and provides a planar structure as shown in FIG. 8. The remaining high k dielectric material layer 30 within the deep trench 20 is now referred to herein as a high k dielectric material portion 30P.

At this point of the present application, the deep trench 20 is provided with a capacitor structure that includes, metal liner 22 lining sidewalls of the deep trench 20, the layer of dielectric material 24 located on a horizontal surface of the metal liner at the bottom of the deep trench 20, a plurality of nanoparticle seed layers 26 having a density sufficient enough to provide a conductive path across the layer of dielectric material 24, conducting carbon nanotubes 28 extending vertical upwards from a surface of each nanoparticle seed layer 26, a high k dielectric portion 30P that lines each conducting carbon nanotube 28 and is present on exposed vertical sidewalls of the metal liner 20, and a conductive material 32 filling the remaining volume of the deep trench 20.

Figure 9:
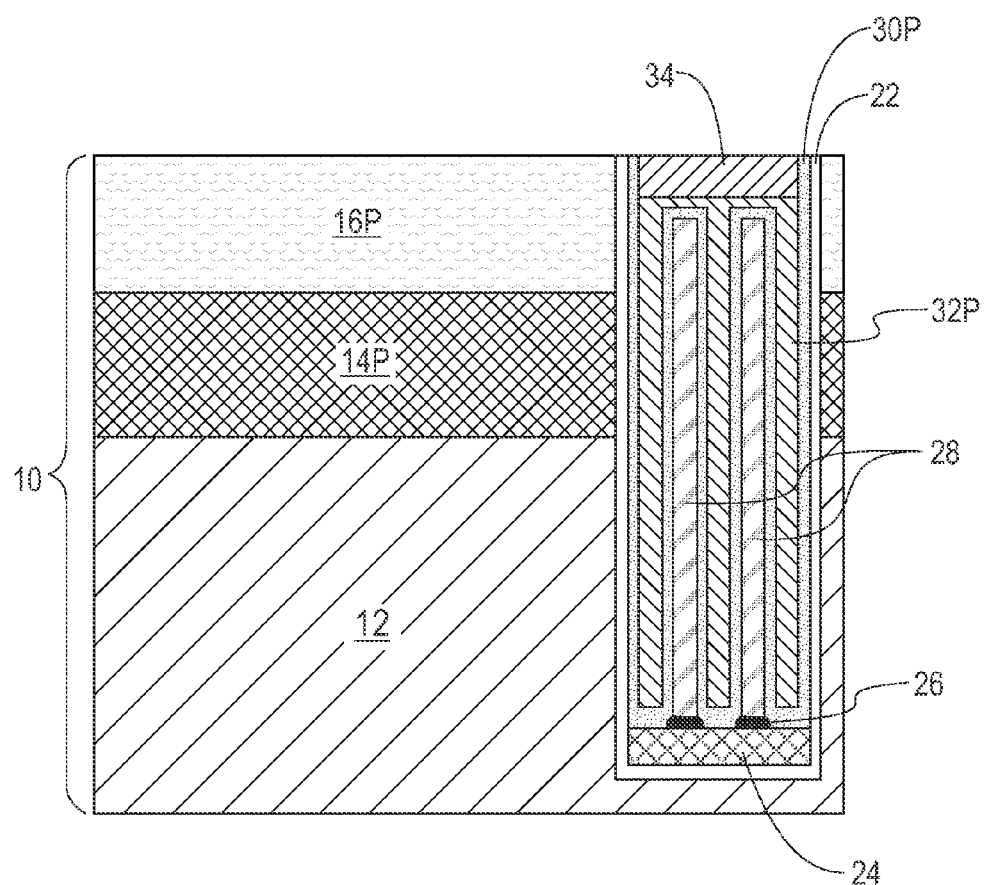
FIG. 9 is a cross sectional view of the exemplary semiconductor structure of FIG. 8 after recessing the conductive material to provide a conductive material plug and forming a dielectric cap on the topmost surface of the conductive material plug, wherein the dielectric cap has a topmost surface that is coplanar with a topmost surface of the topmost semiconductor layer.

Referring now to FIG. 9, there is illustrated the exemplary semiconductor structure of FIG. 8 after recessing the conductive material 32 to provide a conductive material plug 32P and forming a dielectric cap 34 on the topmost surface of the conductive material plug 32P, wherein the dielectric cap 34 has a topmost surface that is coplanar with a topmost surface of the remaining topmost semiconductor layer, i.e., topmost semiconductor portions 16P. The capacitor structure is the same as described above expect that the conductive material 32 is replaced with conductive material plug 32P.

The recessing of the conductive material 32 can be performed utilizing an etching process that is selective in removing the conductive material. In one embodiment of the present application, the recessing of the conductive material 32 can be performed utilizing a reactive ion etch process. The remaining conductive material plug 32 has a height that is above the height of each high k dielectric material coated conducting carbon nanotube.

After recessing the conductive material 32, dielectric cap 34 is formed on the exposed surface of the conductive material plug 32P. The dielectric cap 34 includes a dielectric material such as for example, silicon dioxide, silicon nitride and/or silicon oxynitride. The dielectric cap 34 can be formed by a deposition process including, for example, chemical vapor deposition, and plasma enhanced chemical vapor deposition. Following the deposition process, a planarization process is performed to provide the exemplary structure shown in FIG. 9. The planarization process removes excess dielectric cap material and removes the hard mask portions 18P from the structure. The dielectric cap 34 can have a thickness from 1 to 20 nm. Other thicknesses can also be used for the thickness of the dielectric cap 34.

Figure 10:
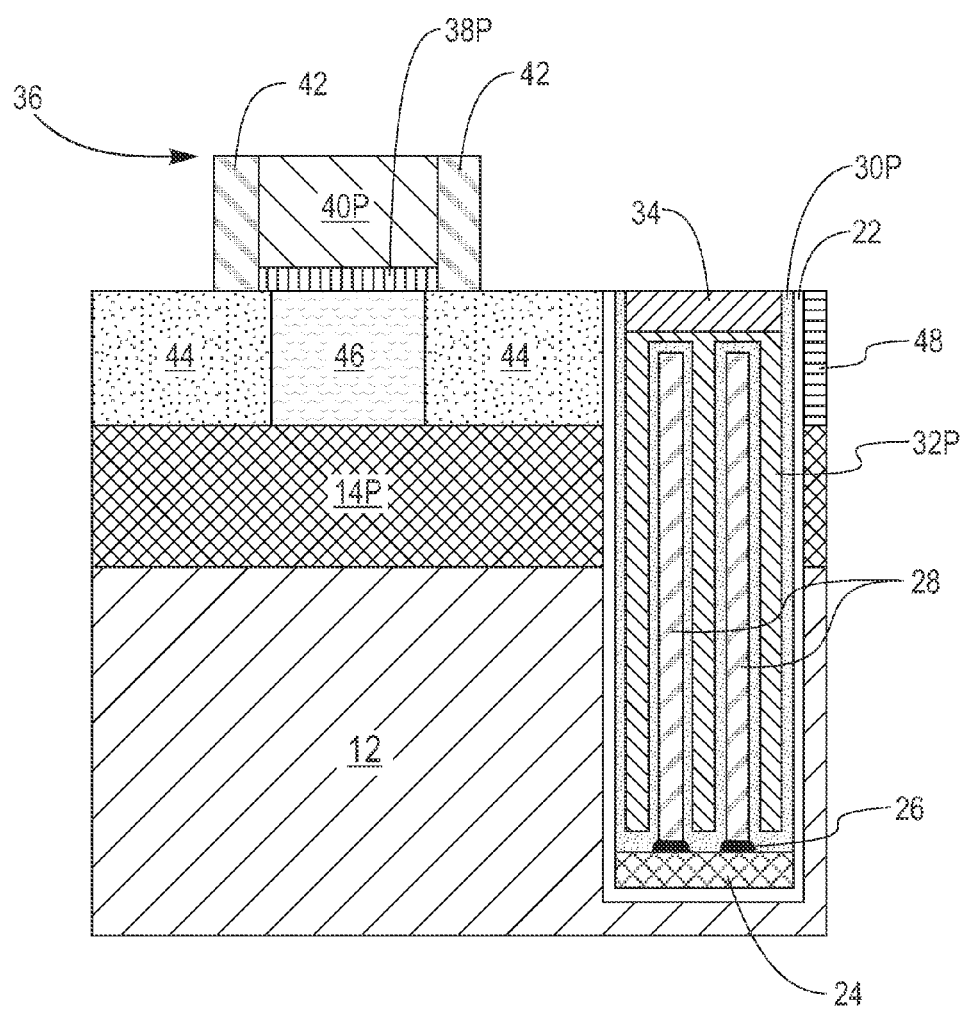
FIG. 10 is a cross sectional view of the exemplary semiconductor structure of FIG. 9 after forming a functional gate structure adjacent the deep trench.

Referring now to FIG. 10, there is illustrated the exemplary semiconductor structure of FIG. 9 after forming a functional gate structure 36 adjacent the deep trench 20. The term "functional gate structure" is used throughout the present application as a permanent gate structure used to control output current (i.e., flow of carriers in the channel) of a semiconducting device through electrical or magnetic fields. The functional gate structure 36 can be formed utilizing a gate first or a gate last processing flow. The functional gate structure 36 can also be referred to herein as an access transistor.

In some embodiments and prior to forming the functional gate structure 36, an upper portion of the semiconductor substrate, i.e., the topmost semiconductor layer can be processed by lithography and etching or a sidewall image transfer process to include one or more semiconductor fin structures. In such an embodiment, the functional gate structure 36 would straddle (i.e., by present on the topmost and sidewall surfaces) each fin structure. In this embodiment, a finFET is provided. As used herein, a "fin" refers to a contiguous structure including a semiconductor material and a pair of vertical sidewalls that are parallel to each other. As used herein, a surface is "vertical" if there exists a vertical plane from which the surface does not deviate by more than three times the root mean square roughness of the surface. Each semiconductor fin structure can have a height from 10 nm to 100 nm, and a width from 4 nm to 30 nm. Other heights and widths are also possible.

The functional gate structure 36 includes a gate stack of, from bottom to top, a gate dielectric portion 38P and a gate conductor portion 40P. A dielectric spacer 42 is located on the sidewalls of the gate stack (38P, 40P). In some embodiments, a trench isolation structure 48 can be formed adjacent the side of the deep trench that is opposite the side of the deep trench 20 including the functional gate structure 36. The functional gate structure 36 also includes source/drain regions 44 located within the topmost semiconductor portion 16P that is located adjacent the deep trench 20, and a channel region 46 positioned between each source/drain regions 44 and located directly beneath the gate stack (38P, 40P). In the particular embodiment illustrated, the source/drain regions 44 and the channel region 46 are each present in one of the topmost semiconductor portions 16P.

The gate dielectric portion 38P of the functional gate structure 36 includes a gate dielectric material. The gate dielectric material that provides the gate dielectric portion 38P can be a semiconductor oxide, a semiconductor nitride, and/or a semiconductor oxynitride. In one example, the gate dielectric material that can provide the gate dielectric portion 38P can be composed of silicon dioxide, silicon nitride and/or silicon oxynitride. In another embodiment of the present application, the gate dielectric material that can provide the gate dielectric portion 38P may include a high k gate dielectric material including one of the high k dielectric materials mentioned above. In some embodiments, a multilayered gate dielectric structure comprising different gate dielectric materials, e.g., silicon dioxide, and a high k gate dielectric material can be formed and used as the gate dielectric portion 38P.

In some embodiments of the present application, the gate dielectric material that provides the gate dielectric portion 38P can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric portion 38P can be formed by a thermal growth technique such as, for example, thermal oxidation and/or thermal nitridation. In yet a further embodiment of the present application, a combination of a deposition and thermal growth may be used in forming a multilayered gate dielectric structure that can provide the gate dielectric portion 38P. In one embodiment of the present application, the gate dielectric material that provides the gate dielectric portion 38P can have a thickness in a range from 1 nm to 10 nm. Other thicknesses that are lesser than or greater than the aforementioned thickness range can also be employed for the gate dielectric material that provides the gate dielectric portion 38P.

The gate conductor portion 40P of the functional gate structure 36 is comprised of any gate conductor material.

Examples of gate conductor materials that can provide the gate conductor portion 40P include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor material that provides the gate conductor portion 40P is comprised of a doped polysilicon or doped polysilicon germanium. In another embodiment, a lower portion of the gate conductor material that provides the gate conductor portion 40P is comprised a conductive material other than doped polysilicon or doped polysilicon germanium, and an upper portion of the gate conductor material that provides the gate conductor portion 40P is comprised doped polysilicon or doped silicon germanium.

The gate conductor material that provides the gate conductor portion 40P can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor that provides the gate conductor portion 40P has a thickness from 1 nm to 100 nm. Other thicknesses that are lesser than or greater than the aforementioned thickness range can also be employed for the gate conductor material that provides the gate conductor portion 40P.

The dielectric spacer 42 can be formed by first providing a spacer material and then etching the spacer material. The dielectric spacer 42 may be formed prior to or after formation of the gate stack. The spacer material that provides dielectric spacer 42 may be composed of any dielectric spacer material including, for example, a dielectric oxide, dielectric nitride, and/or dielectric oxynitride. In one example, the spacer material used in providing the dielectric spacer 42 may be composed of silicon dioxide or silicon nitride. The spacer material that provides the dielectric spacer 42 can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

Source/drain regions 44 can be formed either prior to or after formation of the gate stack. In some embodiments, source/drain extension regions (not separately shown) are typically formed prior to forming the dielectric spacer 42 utilizing an extension ion implantation process. As such, a portion of each of the source extension region and drain extension region would be located beneath the dielectric spacer 42. After forming the dielectric spacer 42, source/drain regions 44 are formed utilizing a source/drain ion implantation process. An activation anneal may follow the implantation processes. The source/drain regions 44 (including the corresponding source/drain extension regions) may be doped with a p-type or n-type dopant. The term "p-type" refers to the addition of impurities to an intrinsic semiconductor that creates deficiencies of valence electrons. In a silicon-containing material, examples of p-type dopants, i.e., impurities, include, but are not limited to, boron, aluminum, gallium and indium. "N-type" refers to the addition of impurities that contributes free electrons to an intrinsic semiconductor. In a silicon containing material examples of n-type dopants, i.e., impurities, include, but are not limited to, antimony, arsenic and phosphorous. The concentration of dopants within the source/drain regions 44 (and corresponding source/drain extension regions) can be within ranges typically used in forming metal oxide semiconductor field effect transistors (MOSFETs).

The trench isolation structure 48 can be formed utilizing a conventional trench isolation process well known to those skilled in the art. For example, lithography, etching and filling of the trench with a trench dielectric such as an oxide may be used in forming the trench isolation structure 48. The trench that provides the trench isolation structure 48 is shallower than the deep trench 20. In the illustrated embodiment, the trench that provides the trench isolation structure 48 extends to the topmost surface of one of the insulator portions 14P. Optionally, a liner may be formed in the trench prior to trench fill, a densification step may be performed after the trench fill and a planarization process may follow the trench fill as well.

Figure 11:
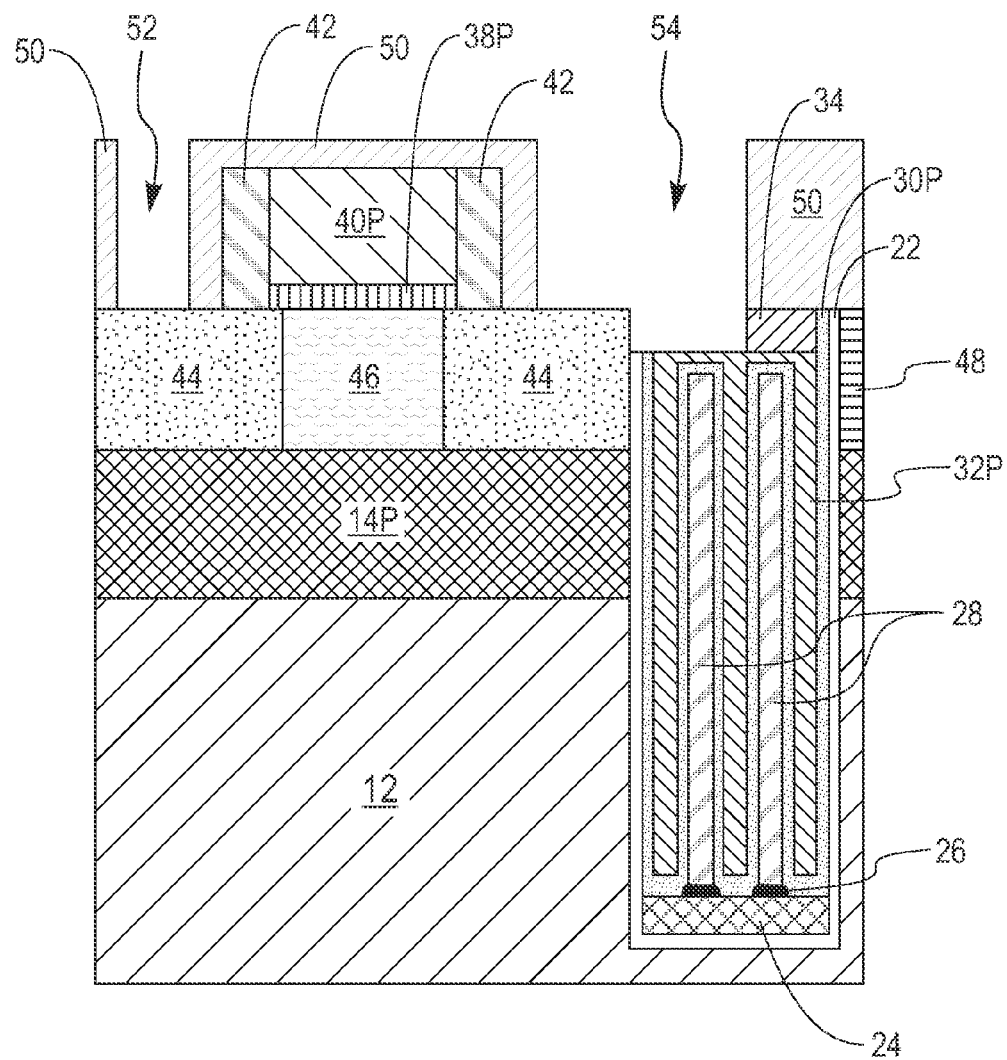
FIG. 11 is a cross sectional view of the exemplary semiconductor structure of FIG. 10 after forming an interlevel dielectric material, forming a source/drain contact opening and a combined source/drain and deep trench strap opening within the interlevel dielectric material.

Referring now to FIG. 11, there is illustrated the exemplary semiconductor structure of FIG. 10 after forming an interlevel dielectric material 50, forming a source/drain contact opening 52 within the interlevel dielectric material 50 that exposes one of the source/drain regions 44 of the functional gate structure 36, and forming a combined source/drain contact and deep trench strap opening 54 that exposes the other of the source/drain regions 44 and portions of the conductive metal plug 32P in the deep trench 20. In some embodiments of the present application in which the functional gate structure 36 is formed by a gate last process, the interlevel dielectric material 50 is formed prior to formation of the gate stack (48P, 50P). In some embodiments, and as shown, the interlevel dielectric material 50 has a topmost surface that extends above the topmost surface of the gate stack. In other embodiments of the present application (not shown), the interlevel dielectric material 50 has a topmost surface that is coplanar with the topmost surface of the gate stack.

In some embodiments, the interlevel dielectric material 50 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the interlevel dielectric material 50. The use of a self-interlevel dielectric material as the interlevel dielectric material 50 may avoid the need to perform a subsequent planarizing step.

In one embodiment, the interlevel dielectric material 50 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the interlevel dielectric material 50. The thickness of the interlevel dielectric material 50 that can be employed in the present application may vary depending on the type of dielectric material employed as well as the method that was employed in forming the same. In one embodiment, the interlevel dielectric material 50 has a thickness from 80 nm to 500 nm. Other thicknesses that are greater or lesser than the range provided above can also be used for the interlevel dielectric material 50.

The source/drain contact openings 52 and the combined source/drain contact and deep trench strap opening 54 can be formed by lithography and etching. A single etch or multiple etching steps may be used to form the source/drain contact openings 52 and the combined source/drain contact and deep trench strap opening 54. The etch or etching processes may include a dry etching process and/or a wet etch process.

Figure 12:
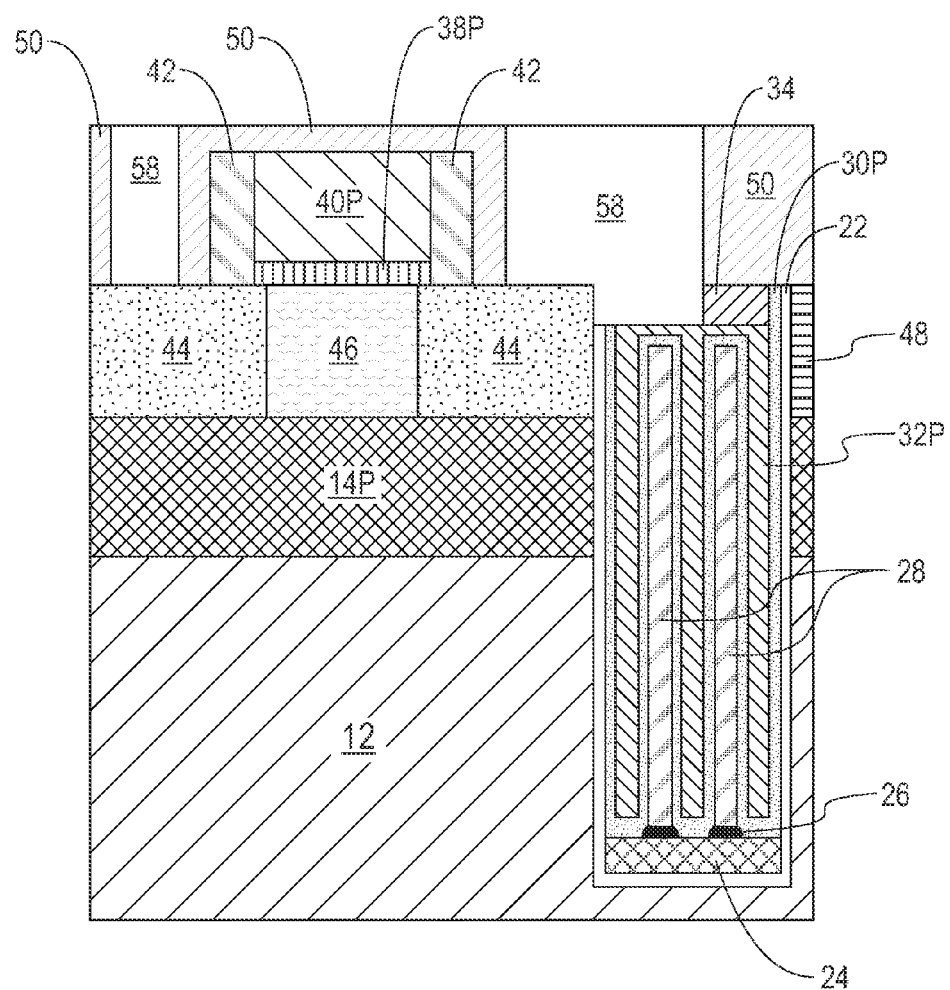
FIG. 12 is a cross sectional view of the exemplary semiconductor structure of FIG. 11 after forming a deep trench strap contact portion and a bitline contact portion.

Referring now to FIG. 12, there is illustrated the exemplary semiconductor structure of FIG. 11 after forming a deep trench strap contact portion 56 within the combined source/drain contact and deep trench strap opening 54 and a bitline contact portion 58 within the source/drain contact opening 52. In some embodiments, the deep trench strap contact portion 56 and bitline contact portion 58 may comprise a same conductive material. In other embodiments, the deep trench strap contact portion 56 and bitline contact portion 58 comprise different conductive materials; in such an embodiment block mask technology may be used to provide the different conductive materials. The deep trench strap contact portion 56 and bitline contact portion 58 may include one of the conductive materials mentioned above in providing the conductive material 32 to the deep trench 20. In some embodiments, the deep trench strap contact portion 56 and/or bitline contact portion 58 comprise a same conductive material as conductive material 32 provided to the deep trench 20. In other embodiments, the deep trench strap contact portion 56 and bitline contact portion 58 comprise a different conductive material as that as conductive material 32 provided to the deep trench 20. Typically, the deep trench strap contact portion 56 and bitline contact portion 58 comprise a conductive metal such as, for example, tungsten.

The conductive material that provides the deep trench strap contact portion 56 and bitline contact portion 58 can be formed utilizing one of the deposition process used in providing conductive material 32 to the deep trench 20. Following deposition of the conductive material that provides bitline contact portion 58, a planarization process may be performed to provide the planar structure illustrated in FIG. 12.

It is noted that the above represents one processing scheme that can be used in contacting the one of the source/drain regions 44 of the functional gate structure 36 to the conductive material plug 32P in the deep trench 20. Other processing schemes as well known to those skilled in the art for contacting the one of the source/drain regions 44 of the functional gate structure 36 to the conductive material plug 32P in the deep trench 20 can also be used in the present application.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a capacitor structure present in a deep trench that is located within a semiconductor substrate, said capacitor structure comprising:
a metal liner located on sidewalls and a bottom wall of said deep trench;
a layer of dielectric material located on a horizontal surface of said metal liner;
a plurality of nanoparticle seed layers located on a topmost surface of said layer of dielectric material;
conducting carbon nanotubes extending vertical upwards from a surface of each nanoparticle seed layer;
a high k dielectric portion lining each conducting carbon nanotube and present on exposed vertical sidewalls of said metal liner; and a conductive material plug filling said remaining volume of said deep trench.

2. The semiconductor structure of claim 1, wherein said conducting carbon nanotubes are metallic carbon nanotubes.

3. The semiconductor structure of claim 1, wherein said plurality of nanoparticle seed layers has a density sufficient to provide a conductive path across said layer of dielectric material.

4. The semiconductor structure of claim 1, wherein said semiconductor substrate comprises a conductive region in which at least a lower portion of said deep trench is present.

5. The semiconductor structure of claim 1, wherein said semiconductor structure includes a semiconductor on insulator substrate, and wherein a handle substrate of said semiconductor-on insulator comprises a conductive region in which at least a lower portion of said deep trench is present.

6. The semiconductor structure of claim 1, further comprising a functional gate structure located on a semiconductor portion of said semiconductor substrate and located adjacent one side of said deep trench.

7. The semiconductor structure of claim 6, wherein a source/drain region of said functional gate structure is connected to said conductive material plug by a deep trench strap contact portion.

8. The semiconductor structure of claim 1, further comprising a dielectric cap located on a surface of said conductive material plug.

9. The semiconductor structure of claim 6, further comprising a trench isolation structure located within said semiconductor substrate and adjacent another side of said deep trench.

10. The semiconductor structure of claim 6, wherein said functional gate structure is located on a semiconductor portion of a semiconductor-on-insulator substrate.

11. The semiconductor structure of claim 1, wherein said layer of dielectric material contacts a lower portion of said vertical sidewalls of said metal liner.

* * * * *